(12) United States Patent
Tsai et al.

(10) Patent No.: US 12,326,763 B2
(45) Date of Patent: Jun. 10, 2025

(54) COMPONENT CADDIES

(71) Applicant: Hewlett-Packard Development Company, L.P., Spring, TX (US)

(72) Inventors: Ming-Shan Tsai, Taipei (TW); Shih-Tun Yu, Taipei (TW); Hsin-Tso Lin, Taipei City (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 380 days.

(21) Appl. No.: 18/007,360

(22) PCT Filed: Jul. 31, 2020

(86) PCT No.: PCT/US2020/044614
§ 371 (c)(1),
(2) Date: Jan. 30, 2023

(87) PCT Pub. No.: WO2022/025930
PCT Pub. Date: Feb. 3, 2022

(65) Prior Publication Data
US 2023/0273653 A1 Aug. 31, 2023

(51) Int. Cl.
*G06F 1/18* (2006.01)
*H01R 12/71* (2011.01)
*H01R 12/73* (2011.01)
*H01R 13/627* (2006.01)
*H05K 7/20* (2006.01)

(52) U.S. Cl.
CPC ........... *G06F 1/181* (2013.01); *H01R 12/714* (2013.01); *H01R 13/6273* (2013.01); *H05K 7/20509* (2013.01); *H01R 12/737* (2013.01); *H01R 2201/06* (2013.01)

(58) Field of Classification Search
CPC ..... G06F 1/181; H01R 12/714; H01R 12/737; H01R 13/6273; H01R 2201/06; H05K 7/20509
USPC .......................................................... 439/62
See application file for complete search history.

(56) References Cited

U.S. PATENT DOCUMENTS

| | | | |
|---|---|---|---|
| 6,116,957 A * | 9/2000 | Mickievicz | H01R 12/721 439/631 |
| 6,447,310 B1 * | 9/2002 | Brown | H01R 12/716 439/607.07 |
| RE38,089 E | 4/2003 | Kajiura | |
| 6,994,591 B2 | 2/2006 | Huang | |

(Continued)

FOREIGN PATENT DOCUMENTS

| | | |
|---|---|---|
| CN | 1083955 A | 3/1994 |
| CN | 102509957 A | 6/2012 |

(Continued)

*Primary Examiner* — Gary F Paumen
(74) *Attorney, Agent, or Firm* — Quarles & Brady LLP

(57) ABSTRACT

In an example, a component caddy may include a bracket to receive a computing component; a ground portion disposed on a first end of the bracket to electrically engage with a ground pad; and a connector lock disposed on the ground portion. The connector lock may vertically attach the component caddy to a vertically-oriented connector disposed adjacent to the ground pad on a system board such that the computing component is operably engaged with the connector in a vertical orientation and electrically grounded to the ground pad through the ground portion on the bracket.

15 Claims, 7 Drawing Sheets

(56) References Cited

U.S. PATENT DOCUMENTS

| | | | |
|---|---|---|---|
| 7,039,299 B2 | 5/2006 | Onodera | |
| 7,044,748 B2 | 5/2006 | Korsunsky et al. | |
| 7,517,231 B2 | 4/2009 | Hiew et al. | |
| 7,736,176 B2 * | 6/2010 | Zhang | H01R 24/64 439/541.5 |
| 8,403,701 B2 * | 3/2013 | Han | H01R 13/6596 439/607.26 |
| 8,508,928 B2 | 8/2013 | Killen et al. | |
| 8,717,752 B2 * | 5/2014 | Dunham | H05K 1/141 361/679.02 |
| 8,721,350 B2 * | 5/2014 | Liu | H01R 12/73 439/74 |
| 9,252,530 B2 | 2/2016 | Zhang et al. | |
| 9,406,345 B2 | 8/2016 | Yang et al. | |
| 9,426,920 B2 | 8/2016 | Terwilliger et al. | |
| 10,038,262 B1 * | 7/2018 | Behziz | H01R 12/7082 |
| 2003/0022559 A1 | 1/2003 | Musolf et al. | |
| 2014/0145571 A1 | 5/2014 | Morse et al. | |
| 2016/0249455 A1 | 8/2016 | Yang | |
| 2020/0089288 A1 | 3/2020 | Chung | |
| 2020/0144751 A1 | 5/2020 | Suda et al. | |

FOREIGN PATENT DOCUMENTS

| | | |
|---|---|---|
| CN | 105794328 A | 7/2016 |
| CN | 107293916 A | 10/2017 |
| CN | 109983855 A | 7/2019 |
| EA | 007249 B1 | 8/2006 |
| EP | 0584728 A2 | 3/1994 |
| RU | 2595252 C2 | 8/2016 |

* cited by examiner

COMPONENT CADDIES

BACKGROUND

Electronic devices such as computing devices may include various components and electronics. Such components may include processors, storage drives, graphics cards, memory, and the like. Often, such components are engaged with connectors attached to a printed circuit board, system board, motherboard, daughter board, etc. Such components may also be disposed within a housing or chassis of such electronic devices, thereby occupying interior volume of such a housing.

DETAILED DESCRIPTION

Figure 1:
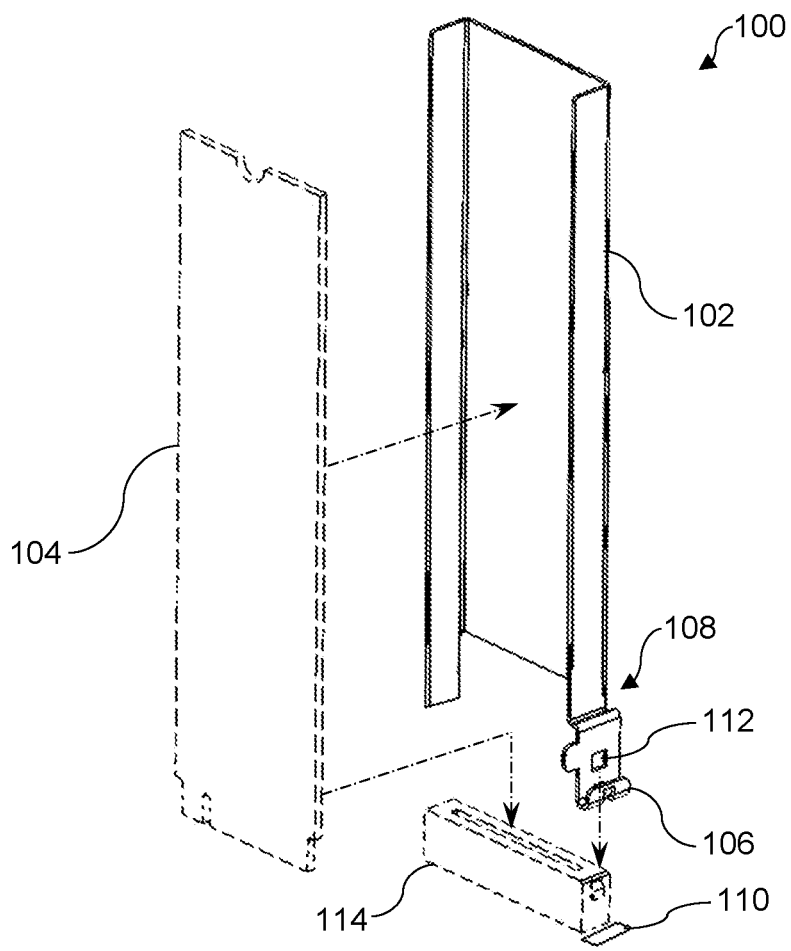
FIG. 1 is a perspective view of an example component caddy.

As described above, electronic devices such as computing devices may include various computing or electronic components to help carry out the functionalities of the computing device. Such devices may include, but are not limited to, processors, memory, storage drives, expansion cards, graphics cards, power supplies, and other components suitable for use with a computing device. Such components often are both mechanically and electrically supported within a computing device through the use of connectors, contacts, wires, fasteners, various structural components, etc. Such components and associated supporting components and devices occupy an internal volume of a chassis, housing, or case of such a computing device, where such volume is often at a premium.

In some situations, components may be disposed in a horizontal manner covering a portion of a printed circuit board or system board of a computing device due to the orientation of a connector of such component. Often this results in such component occupying and/or overlaying circuit board area, thereby limiting the placement and/or orientation of other components that also are to be attached to or engaged with a connector on such a circuit board. This may result in having computing devices with larger-than-necessary system boards and/or chassis or enclosures, due to less-than-optimal orientation and disposition of components within.

Thus, it may be desirable to orient certain components within a computing device in a vertical manner with respect to a system board or circuit board with which it is engaged in order to minimize the occupied footprint of the component. Such an orientation, however, often results in instability with the installation of components and the possibility that such components could be knocked loose during transit, assembly, or even use, thereby negatively affecting the performance or function of the computing device. Further, some components may benefit from having multiple points of contact with the circuit board and/or substrate on which it is installed, e.g., to establish an electrical grounding, etc., which vertical installation often cannot provide.

It may be desirable, in some situations, to be able to install components within a computing device in an optimal manner to make efficient use of the interior volume and/or circuit board area available. Further, it is desirable to ensure that such optimal orientation and installation of components provides for a stable disposition of the components in all directions. Yet further, ensuring that such components have access to beneficial additional contact areas, e.g., a grounding pads, etc., is also desirable.

Implementations disclosed herein provide examples of component caddies to aid in the convenient and optimal installation of computing components within a computing device. Such examples of component caddies allow a slim vertical installation of components, thus reserving circuit board area for use of other components or enabling a decrease in the size of such a circuit board used in the computing device. Finally, such examples of component caddies further provide an ability for components supported within to have access to external contact areas such as grounding pads to ensure reliable and strong performance of such a component.

Referring now to FIG. 1, a perspective view of an example component caddy 100 is illustrated. Component caddy 100 may include a bracket 102 to receive a computing component 104. Further, component caddy 100 may include a ground portion 106 disposed on a first end 108 of the bracket to electrically and/or conductively engage with a ground pad 110. Component caddy 100 may include a connector lock 112 disposed on the ground portion 106 to vertically attach the component caddy 100, and/or the bracket 102 thereof, to a vertically-oriented connector 114 disposed adjacent to the ground pad 110 on a system board (not shown) such that the computing component 104 is operably engaged with the connector 114 in a vertical orientation and electrically grounded to the ground pad 110 through the ground portion 106.

Figure 2A:
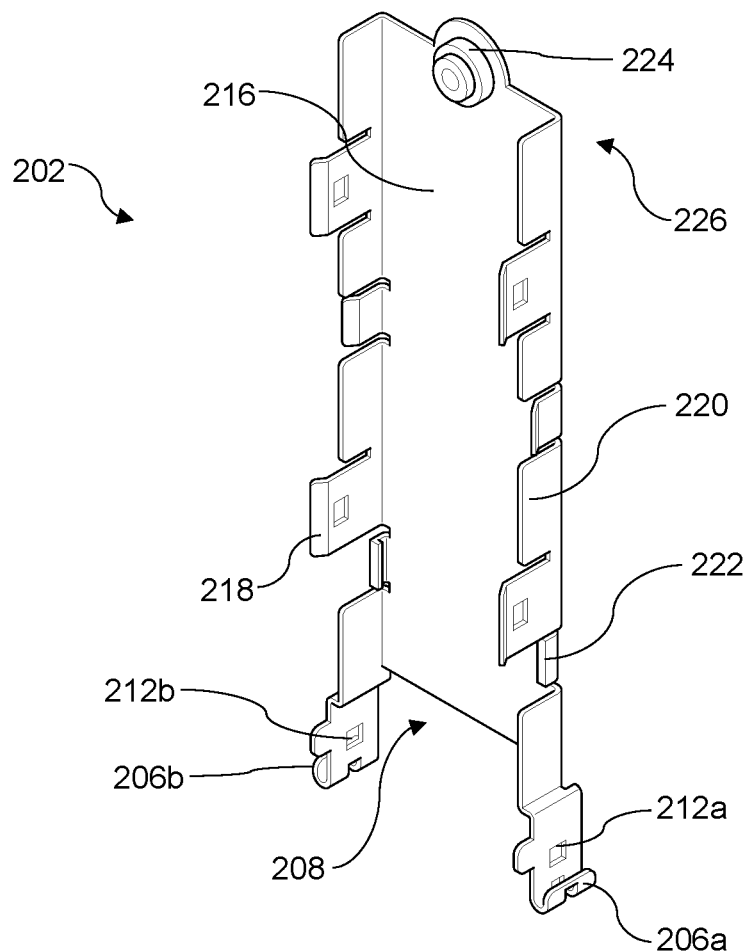
FIG. 2A is a perspective view of an example bracket of an example component caddy.
Figure 2B:
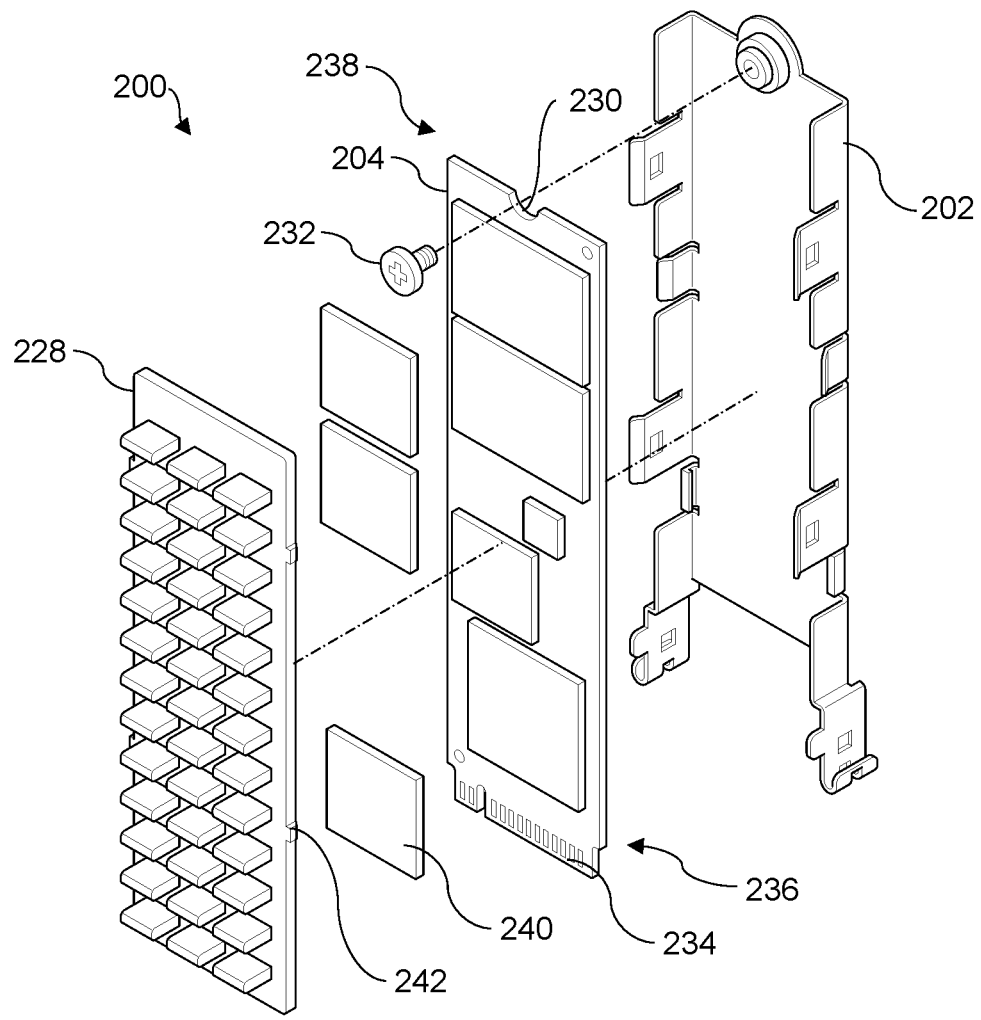
FIG. 2B is an exploded perspective view of an example component caddy having the bracket of FIG. 2A.
Figure 2C:
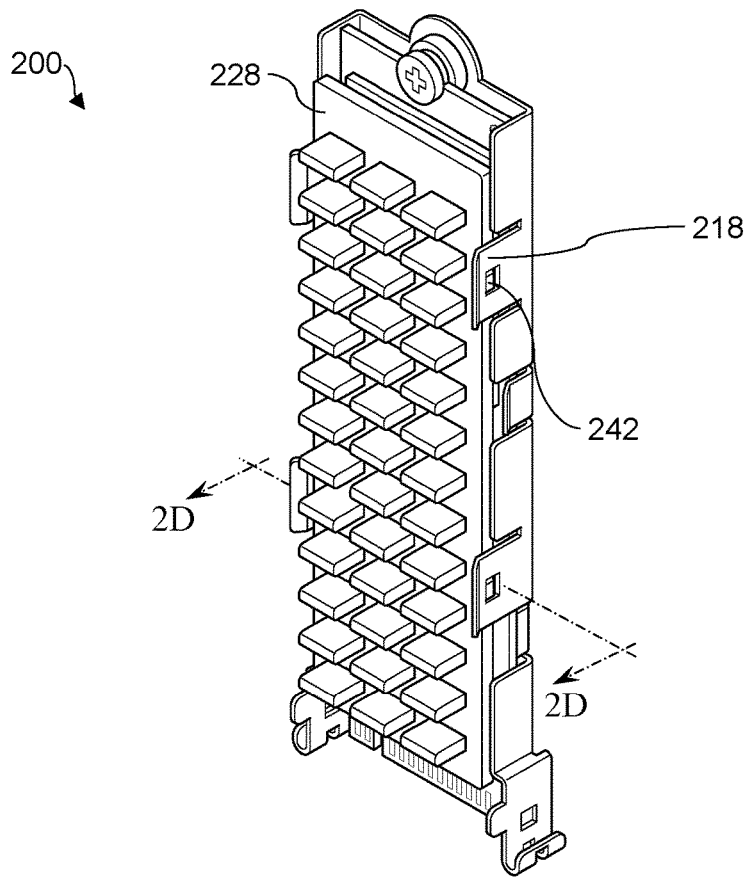
FIG. 2C is a perspective view of the example component caddy of FIG. 2B.
Figure 2D:
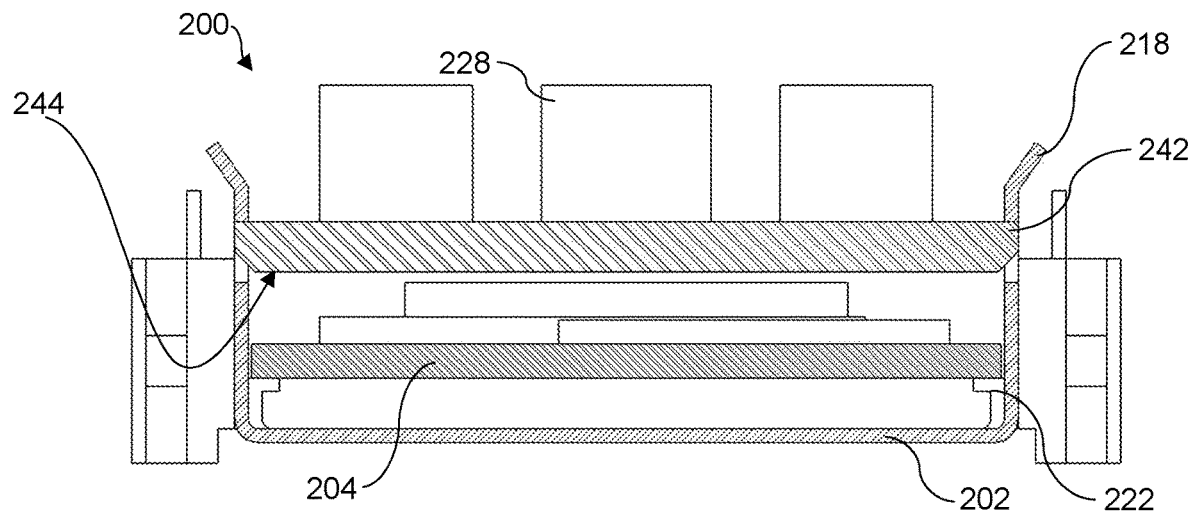
FIG. 2D is a cross-sectional view of the example component caddy of FIG. 2B.

Referring now to FIG. 2A, a perspective view of an example bracket 202 for use with another example component caddy 200 (illustrated in FIGS. 2B-2D). Example component caddy 200 may be similar to other example component caddies described herein. Further, the similarly-named elements of example component caddy 200 may be similar in function and/or structure to the respective elements of other example component caddies, as they are described herein.

In some examples, the bracket 202 may be a rigid or semi-rigid component capable of mechanically supporting, attaching to, and/or receiving a computing component. The bracket 202 may be an elongate member in some examples, i.e., a width of the bracket 202 may be shorter than a length of the bracket 202. In some examples, the bracket 202 may partially or wholly enclose such a computing component and/or a portion thereof. Further, bracket 202 may have a sufficiently rigid structure so as to be able to support the size and weight of such a computing component when such component may be standing on end or in a vertical orientation. In some implementations, the bracket 202 may be constructed of a metallic material, such as sheet metal. In further examples, bracket 202 may be formed by stamping or bending sheet metal from a single unitary piece into a desired or appropriate shape so as to support a computing component. In other examples, bracket 202 may be formed of another material, e.g., a polymer material, and may be formed through plastic-injection molding, overmolding, and the like. In yet other implementations, bracket 202 may be formed from assembling and/or attaching multiple separate components together.

Bracket 202 may include a central portion 216, in some examples. Bracket 202 may further include a retention clip 218 or a plurality of retention clips 218. Such retention clips may extend from the central portion and, in further examples, may extend laterally or orthogonally from the central portion. Further, such retention clips 218 may retain, hold, or assist in retaining or holding the computing component to the bracket 202 in an assembled state. Additionally, in further examples, bracket 202 may include a sidewall or a plurality of sidewalls 220, or portions thereof, extending from the central portion 216. Sidewall portions 220 may be disposed adjacent to or aligned with retention clips 218, in some examples. Such sidewall portions 220 may extend orthogonally or laterally from the central portion 216 such that the central portion 216, the retention clips 218, and the sidewall portions 220 form and/or define a trough, channel, or substantially U-shaped bracket 202 so as to be able to receive a computing component within the bracket 202 and in between the retention clips 218 and/or sidewall portions 220. In some examples, the bracket 202, or the central portion 216 thereof, the retention clips 218, and the sidewall portions 220, may all be a unitary component formed from bent or stamped sheet metal.

The bracket 202 may also include a plurality of support pads 222 extending from the central portion 216 against which the computing component is to be supported when the computing component is engaged with or inserted into the bracket 202.

In some examples, the component caddy 200, or the bracket 202 thereof, may include a first ground portion 206*a* disposed at a first end 208 of the bracket 202 and a second ground portion 206*b* disposed at the first end 208 on an opposite side of the bracket 202 from the first ground portion 206*a*. First and second ground portion 206*a* and 206*b* may be referred to collectively as ground portions 206 or individually as a ground portion 206, in some situations. Ground portions 206 may be a bent or rounded member so as to each be able to smoothly engage with an associated ground pad. Further, each ground portion 206 may be constructed of a metallic material or a material capable of conducting electricity so as to be able to electrically ground the bracket 202, or portions thereof, to such ground pads. In some examples, the bracket 202, the retention clips 218, and the ground portions 206 may be unitarily formed of a single bent or stamped metallic sheet material.

Component caddy 200, or bracket 202 thereof, may further include a first connector lock 212*a* and a second connector lock 212*b* disposed on the first ground portion 206*a* and second ground portion 206*b*, respectively. Similarly, in some situations, the first and second connector lock 212*a* and 212*b* may be referred to collectively as connector locks 212 or individually as a connector lock 212. Connector locks 212 may be openings or cavities in the respective ground portions 206 so as to be able to receive or clip on to a suitably sized latch, e.g., latches disposed on a connector, described below.

In some implementations, the bracket 202 may also include a fastener standoff 224 conductively attached to the bracket 202, or the ground portions 206 thereof, at a second end 226, opposite the first end 208 along the longitudinal or elongate length of the bracket 202. The fastener standoff 224 may be an orifice, cavity, aperture, or other opening suitably sized and structured to receive a fastener, e.g., a threaded fastener or bolt. In some examples, the fastener standoff 224 may be substantially centered along a width of the bracket 202, or central portion 216 thereof, at the second end 226. Further, the fastener standoff 224 may be placed or oriented specifically to align with a fastener interface disposed on the computing component with which the bracket 202 is to be assembled. As such, the fastener standoff 224 may be able to abut against or mate with such a fastener interface and, in some examples, may be able to conductively mate or engage with such a fastener interface.

Referring now to FIG. 2B, an exploded perspective view of a component caddy 200 having bracket 202 is illustrated. Component caddy 200 may further include a heat sink 228. Heat sink 228 may be a thermal component capable of conducting thermal energy or transferring heat away from a computing component 204. In some examples, heat sink 228 may include fins, ribs, troughs, or other features to emphasize or improve the heat transfer capabilities of the heat sink 228. Component caddy 200 may also include, in some examples, thermal pads 240 or thermal paste disposed in between the heat sink 228 and the computing component 204. The thermal pads 240 may be made of a highly-conductive material and may increase the thermal connection between the computing component and the heat sink 228 so as to increase the heat transfer efficiency between the two. In some implementations, the heat sink 228 may include a plurality of lock tabs 242 extending laterally form the heat sink 228 to engage with, clip or lock into the plurality of retention clips 218 on the bracket 202 to retain the heat sink 228 to the bracket 202.

Component caddy 200 may also, as described above, include a computing component 204. The computing component 204 may be a storage drive, e.g., flash storage or a solid-state storage drive (SSD), a graphics card, a processor, a network card, another type of expansion card, etc. In some examples, the computing component 204 may be a component that utilizes an edge connector 234 disposed at a first end 236 of the computing component 204 to engage with a communication or expansion slot of a computing device. Edge connector 234 may include electrical pads or contacts, including power and/or signal pads, to operably engage with complementary pads or contacts within a connector or slot thereof. The computing component 204 may include a printed circuit board (PCB) with electrical components disposed or attached thereon and in electrical communication with the edge connector 234. In some implementations, the computing component 204, or the edge connector 234 thereof, may utilize a standardized communication and/or connection specification such as Next Generation Form Factor (NGFF), now known as M.2 specification or form factor, or another type of communication and/or connection standard. In some implementations, the computing component 204 may a storage card utilizing the M.2 form factor standard.

In some examples, the computing component 204 may further include a fastener interface 230 disposed at a second end 238, opposite the first end 236 along a length of the computing component 204. The fastener interface 230, in some examples, may be a cutout, cavity, notch, or another type of opening suitable to receive a fastener. In some examples, the fastener interface 230 may be a rounded cutout to receive and accommodate a threaded fastener such as a screw or bolt. In yet further examples, the fastener interface 230 may accommodate an electrical contact or conductive region so as to be able to transmit or receive an electrical signal. In some examples, the electrical contact or conductive region may act as a ground for the computing component 204 such that a fastener attaching the fastener interface 230 to another metallic component will enable the other metallic component to act a s a ground for the computing component 204. In some examples, the component caddy 200 may further include a fastener 232 to fix the computing component 204 to the bracket 202 and to thereby electrically engage the fastener interface 230 of the computing component 204 to the fastener standoff 224 of the bracket 202. As such, the ground portions 206 of the bracket 202, if engaged with ground pads, may act as electrical grounds for the computing component 204 by way of the electrical connection between the fastener interface 230, the fastener 232, the fastener standoff 224, and the electrically conductive nature of the bracket 202 between the fastener standoff 224 and the ground portions 206.

Referring now to FIG. 2C, a perspective view of component caddy 200 is illustrated in an assembled state. The plurality of lock tabs 242 of the heat sink 228 have been each engaged with one of the plurality retention clips 218 of the bracket 202 so as to retain the heat sink 228 to the bracket 202. Referring additionally to FIG. 2D, a cross-sectional view of example component caddy 200 taken along view line 2D-2D of FIG. 2C is illustrated. As illustrated, the computing component 204 is disposed within the bracket 202 and held in place to the bracket 202 by the heat sink 228, and in some examples, also the thermal pad or pads 240. Stated differently, the engagement of the plurality of lock tabs 242 with the plurality of retention clips 218 retains the computing component 204 in between an inner surface 244 of the heat sink 228 and a plurality of support pads 222 extending from the bracket 202 so as to hold and retain the computing component 204 within the component caddy 200 in a secure state.

Figure 3A:
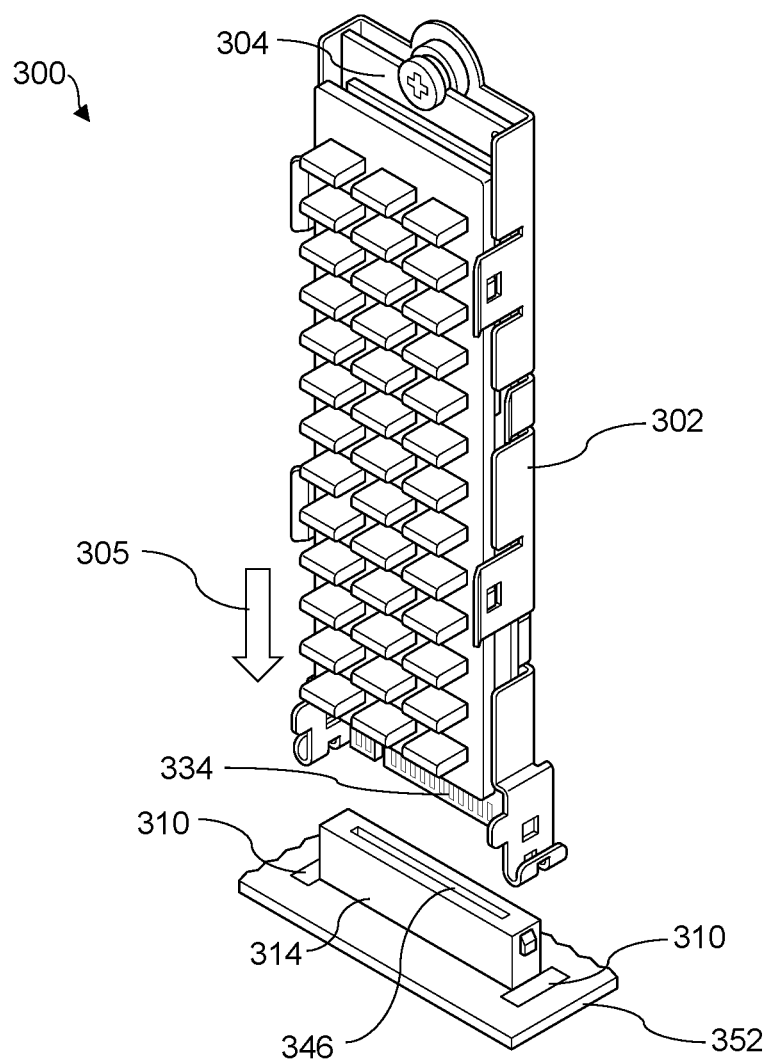
FIG. 3A is a perspective view of another example component caddy.

Referring now to FIG. 3A, a perspective view of another example component caddy 300 is illustrated. Example component caddy 300 may be similar to other example component caddies described herein. Further, the similarly-named elements of example component caddy 300 may be similar in function and/or structure to the respective elements of other example component caddies, as they are described herein.

Component caddy 300 may include a bracket 302 and a computing component 304 disposed and retained within the bracket 302. Computing component 304 may include an edge connector 334 to engage with a complementary engagement slot 346 in a vertically-oriented connector 314. In this context, vertically-oriented may refer to the relative transverse or substantially orthogonal position of the connector 314, the component caddy 300, and the computing component 304 with respect to a printed circuit board (PCB) 352 upon which the connector 314 may be disposed or operably attached. The component caddy 300 and the computing component 304 disposed within may also be vertically-oriented such that the edge connector 334 can directly insert into an engagement slot 346 that is facing away from the PCB 352 due to the vertically-oriented nature of the connector 314. Component caddy 300, and thus edge connector 334 of computing component 304 may move into engagement with the connector 314, e.g., along direction 305, as is described below and illustrated in FIG. 3B.

Figure 3B:
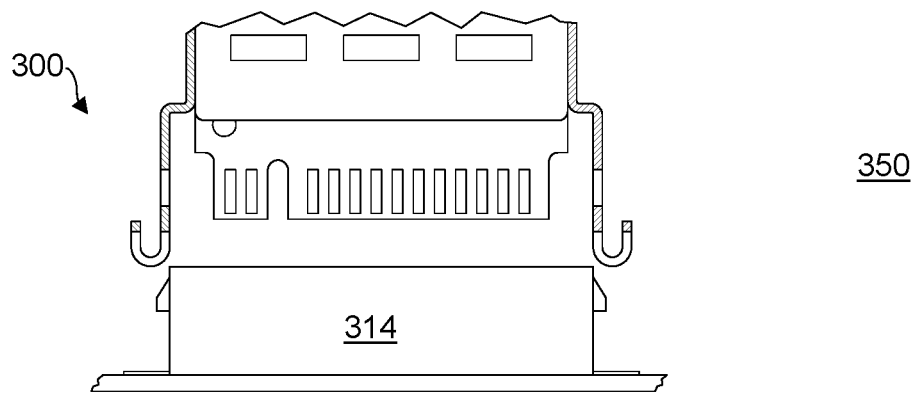
FIG. 3B illustrates various views of the example component caddy of FIG. 3A being engaged with a connector of an example system board.
Figure 3B:
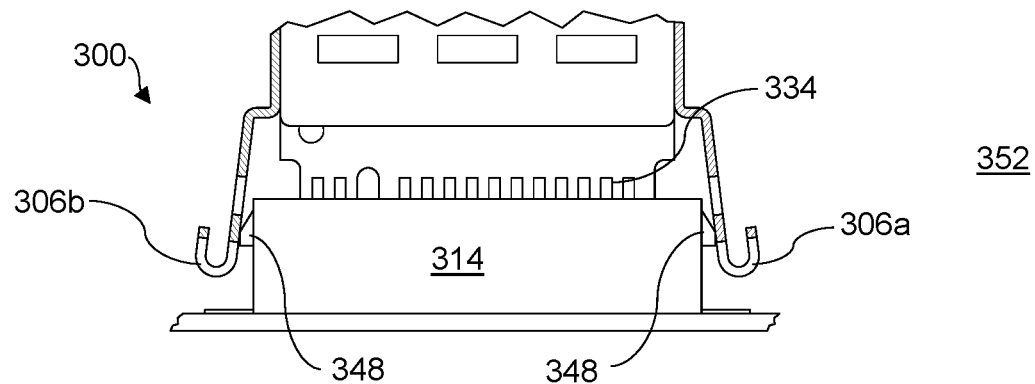
Figure 3B:
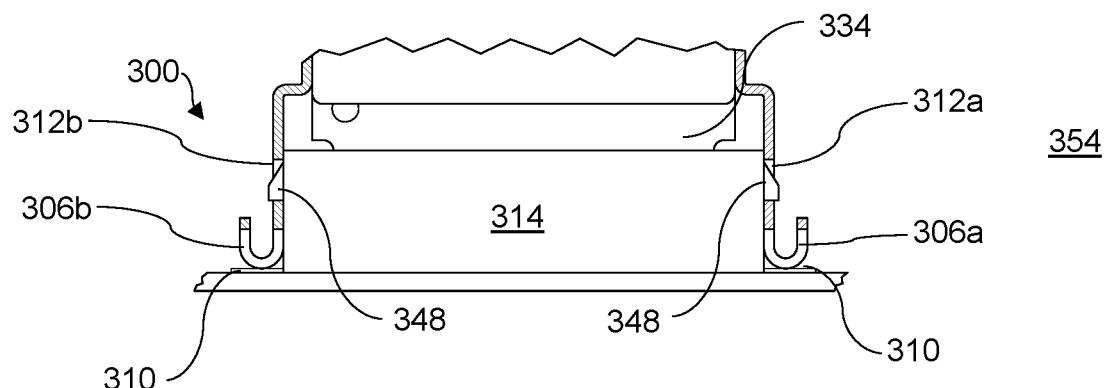

Referring now to FIG. 3B, various views of the example component caddy 300 being engaged with a connector 314 of an example system board or PCB thereof are illustrated. View 350 illustrates the component caddy 300 as it approaches the connector 314. As illustrated in view 352, as first and second ground portions 306a and 306b come into contact with the connector 314, or distal or opposite ends thereof, a pair of latches 348 disposed on such opposite distal ends of the connector push the ground portions 306 outward to create clearance for the bracket 302 to surround the connector 314. At this point, edge connector 334, and electrical pads or contacts thereof, have started to insert into the complementary engagement slot 346 of the connector 314. As illustrated in view 354, edge connector 334, and this computing component 304, has fully operably engaged with the connector 314 and the engagement slot 346 thereof in a vertical orientation so as to establish electrical communication between the computing component 304 and the PCB 352. Additionally, the ground portions 306 have each fully engaged, mated, or contacted with an associated ground pad 310 disposed on the PCB adjacent to the connector 314 or the distal ends thereof so as to establish electrical grounding between the ground pads 310 and the bracket 302, and thus the computing component 304. Yet further, First and second connector locks 312a and 312b have fully engaged or clipped or locked on to respective latches 348 extending laterally from the opposite distal ends of the connector 314. Such engagement between the latches 348 and the connector locks 312 retain the bracket 301 to the connector 314 in a vertical orientation and secures the bracket 302 from movement in all three cartesian directions. As such, the computing component 304 is operably engaged with a connector 314 in a slim vertical manner while also being securely installed and resistant to movement and being electrically grounded.

Figure 4:
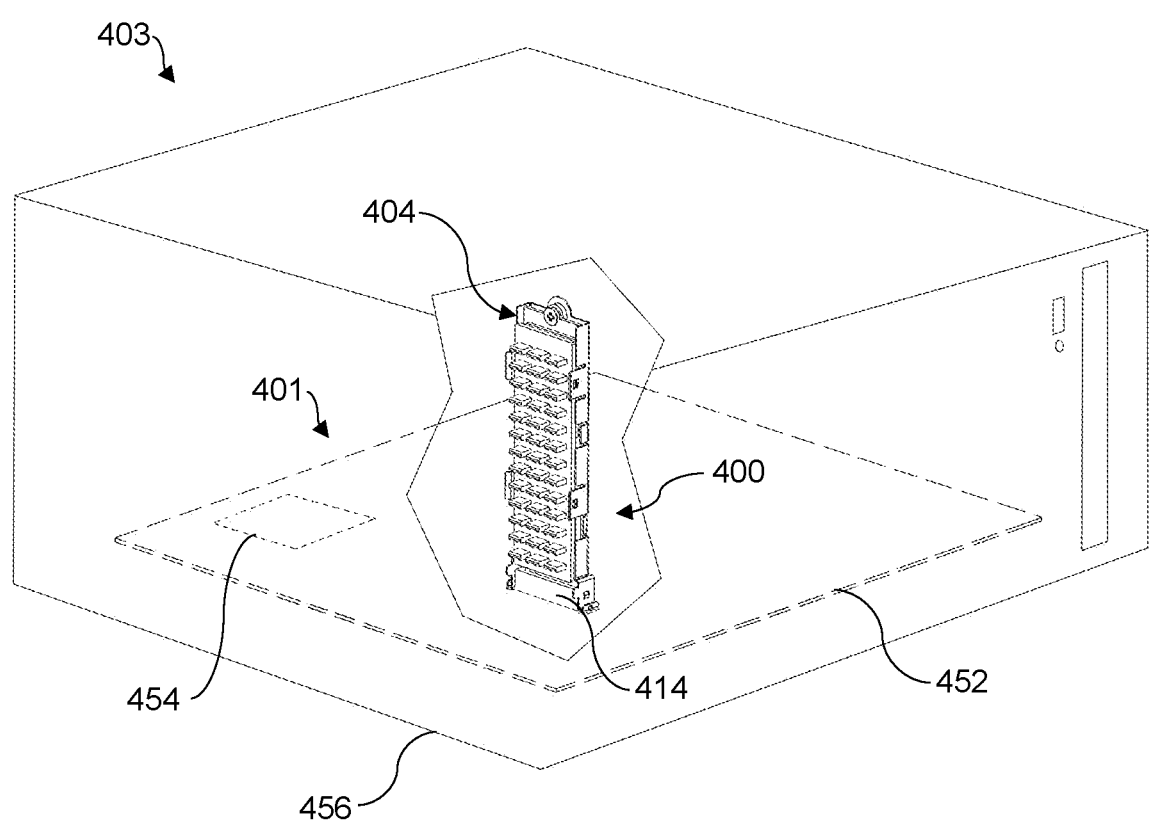
FIG. 4 is a perspective cutaway view of an example computing device having a system board with an example component caddy.

Referring now to FIG. 4, a perspective cutaway view of an example computing device 403 having a system board 401 with an example component caddy 400 is illustrated. Example component caddy 400 may be similar to other example component caddies described herein. Further, the similarly-named elements of example component caddy 400 may be similar in function and/or structure to the respective elements of other example component caddies, as they are described herein.

In some implementations, computing device 403 may be a desktop or all-in-one (AIO) computer, a server, or another type of computing device 403 which may benefit from the use of expansion cards, e.g., computing components, installed into a vertically-oriented connector. Computing device 403 may include a chassis 456 and a system board 401 disposed within the chassis 456. Chassis 456 may be a housing, case, enclosure, etc. and may house, structurally support, and protect computing components disposed within.

System board 401 may include a PCB 452, a processor 454 installed on the PCB, and other suitable components installed on the PCB, e.g., expansion slots or connectors 414. In some examples, the system board 401 may be referred to as a motherboard, a printed circuit assembly (PCA), etc. The PCB may include electrical pathways used to operably connect multiple components of the system board 401. Additionally, system board 401 may include a vertically-oriented connector 414 operably attached to the PCB, and one or multiple ground pads disposed adjacent to the connector 414.

The system board 401 may further include a computing component 404 disposed within the component caddy 400 in order to engage with the connector 414 in a vertical manner to optimize placement of the computing component 404 within the chassis 456 and on the PCB 452. Further, component caddy 400 securely fixes computing component 404 in place in operable engagement with the connector 414 and also ground pads thereby.

What is claimed is:

1. A component caddy, comprising:
a bracket to receive a computing component;
a ground portion disposed on a first end of the bracket to electrically engage with a ground pad; and
a connector lock disposed on the ground portion, the connector lock to vertically attach the component caddy to a vertically-oriented connector disposed adjacent to the ground pad on a system board such that the computing component is operably engaged with the connector in a vertical orientation and electrically grounded to the ground pad through the ground portion on the bracket.

2. The component caddy of claim 1, wherein the bracket includes a central portion and a plurality of retention clips extending orthogonally from the central portion, the retention clips to retain the computing component to the bracket.

3. The component caddy of claim 2, further comprising a heat sink to clip into the plurality of retention clips, the computing component to be held to the bracket by the heat sink.

4. The component caddy of claim 2, wherein the bracket further comprises a plurality of sidewall portions extending orthogonally from the central portion adjacent to the retention clips.

5. The component caddy of claim 2, further comprising a plurality of support pads extending from the central portion against which the computing component is to be supported when the computing component is engaged with the bracket.

6. The component caddy of claim 1, wherein the bracket further includes a fastener standoff at a second end, opposite the first end, and the computing component includes a fastener interface to attach to the fastener standoff with a fastener to fix the computing component to the bracket.

7. A system board, comprising:
a printed circuit board (PCB);
a vertically-oriented connector operably attached to the PCB, the connector having an engagement slot facing away from the PCB and a pair of latches disposed at opposite distal ends of the connector;
a computing component having an edge connector at a first end to operably engage with the engagement slot of the connector in a vertical orientation; and
a component caddy, comprising:
an elongate bracket to receive the computing component;
a first ground portion disposed at a first end of the bracket and a second ground portion disposed at the first end on an opposite side of the bracket from the first ground portion, the first and second ground portion to each contact a ground pad disposed on the PCB adjacent the connector; and
a first connector lock and a second connector lock disposed on the first ground portion and the second ground portion, respectively, the first and second connector lock to each engage with a latch of the connector so as to retain the bracket to the connector in a vertical orientation.

8. The system board of claim 7, wherein the bracket further comprises a fastener standoff conductively attached to the bracket at a second end, opposite the first end.

9. The system board of claim 8, wherein the computing component further includes a fastener interface disposed at a second end, opposite the first end, and the component caddy further includes a fastener to electrically engage the fastener interface to the fastener standoff such that the computing component is electrically grounded to the ground pads of the PCB.

10. The system board of claim 7, wherein the computing component is an M.2 form factor storage drive.

11. A computing device, comprising:
a chassis; and
a system board disposed within the chassis, comprising:
a printed circuit board (PCB);
a processor;
a vertically-oriented connector operably attached to the PCB;
a ground pad disposed adjacent to the connector;
a computing component having an edge connector at a first end to engage with the connector and a fastener interface at a second end, opposite the first end; and
a component caddy, comprising;
a bracket to receive the computing component and having a fastener standoff to conductively engage with the fastener interface of the computing component;
a ground portion extending from the bracket to electrically contact the ground pad;
a connector lock disposed on the ground portion to engage with a latch on a distal end of the connector so as to retain the bracket, and thus the computing component, to the connector in a vertical orientation; and
a heat sink to engage with a plurality of retention clips of the bracket such that the heat sink retains the computing component to the bracket.

12. The computing device of claim 11, wherein the heat sink includes a plurality of lock tabs extending laterally from the heat sink to lock into the plurality of retention clips to retain the heat sink to the bracket.

13. The computing device of claim 12, wherein the engagement of the plurality of lock tabs with the plurality of retention clips is to retain the computing component in between an inner surface of the heat sink and a plurality of support pads extending from the bracket so as to retain the computing component within the component caddy.

14. The computing device of claim 11, wherein the bracket, the retention clips, and the ground portion are unitarily formed of a bent metallic sheet material.

15. The computing device of claim 11, wherein the computing component is an M.2 form factor storage drive.

* * * * *